(12) United States Patent
Ludwig

(10) Patent No.: US 6,940,123 B2
(45) Date of Patent: Sep. 6, 2005

(54) MEMORY CELL ARRAY

(75) Inventor: Christoph Ludwig, Langebrück (DE)

(73) Assignee: Infineon Technologies AG, Munich (DE)

(*) Notice: Subject to any disclaimer, the term of this patent is extended or adjusted under 35 U.S.C. 154(b) by 73 days.

(21) Appl. No.: 10/713,689

(22) Filed: Nov. 14, 2003

(65) Prior Publication Data

US 2004/0099901 A1 May 27, 2004

(30) Foreign Application Priority Data

Nov. 14, 2002 (DE) .......................................... 102 53 164

(51) Int. Cl.⁷ .......................................... H01L 29/788
(52) U.S. Cl. .......................... 257/315; 257/14; 257/77; 257/303; 438/240; 438/931
(58) Field of Search ........................... 257/14, 77, 303; 438/240, 931

(56) References Cited

U.S. PATENT DOCUMENTS 5,614,745 A     3/1997  Motonami
6,335,238 B1 *  1/2002  Hanttangady et al. ...... 438/240

FOREIGN PATENT DOCUMENTS

DE              42 28 679 A1      3/1993

* cited by examiner

*Primary Examiner*—David Nelms
*Assistant Examiner*—Mai-Huong Tran
(74) *Attorney, Agent, or Firm*—Laurence A. Greenberg; Werner H. Stemer; Ralph E. Locher

(57) ABSTRACT

In a matrix-shaped configuration of memory transistors, word lines are disposed on a top side of a semiconductor body and are parallel to one another. Bit lines run transversely with respect thereto and are formed by polysilicon strips which are applied on the top side and are isolated from the semiconductor body by barrier layers functioning as diffusion barriers.

7 Claims, 1 Drawing Sheet

MEMORY CELL ARRAY

BACKGROUND OF THE INVENTION

Field of the Invention

The present invention relates to a memory cell configuration in which an outdiffusion of a dopant from the bit lines is largely avoided.

A memory cell array constitutes a matrix-like configuration of memory transistors in each of which, at a top side of a semiconductor body or substrate, a channel region is present between source/drain regions. The channel region is driven by a gate electrode isolated from the channel region by a gate dielectric.

A storage layer is present in the gate dielectric, the storage layer being provided for the programming of the respective memory cell. Such a storage layer may be, for example, an electrically conductive layer disposed in accordance with a floating gate, or a storage layer sequence provided for charge trapping of hot electrons from the channel (CHE), for example an oxide-nitride-oxide layer sequence (ONO layer sequence).

The gate electrodes are connected row-wise by word lines disposed parallel to and at a distance from one another; the source/drain regions are connected to one another column-wise by bit lines disposed parallel to and at a distance from one another. The word lines are preferably electrically conductive strips on the top side of the configuration. So-called buried bit lines formed as strip-type doped regions in the semiconductor material are suitable as bit lines. The buried bit lines thus directly connect the source/drain regions to one another, which source/drain regions are also formed as doped regions and may, in particular, constitute respective portions of the buried bit lines.

Since, in order to produce the bit lines, a dopant is introduced into the semiconductor material and the dopant outdiffuses from the original region in subsequent heat treatment steps in the production process of the memory cell configuration, the problem arises that this patterning of the memory cell configuration cannot be reduced to arbitrarily small dimensions. The formation of the buried bit lines is usually followed by process steps that are carried out at process temperatures of more than 600° C., e.g. oxidations, depositing of polysilicon, and annealing of implants for activation of the dopings. The thermal loading that occurs in this case leads to an outdiffusion of the dopants of the bit lines, which blur the original dopant profile and enlarge the relevant regions. That imposes technical limits on a scaling of the structure toward ever smaller dimensions. A desired setting of the dopant profile, in particular in the region of the pn junction of the source/drain regions toward the doped well of the semiconductor body, is possible only within limits; an abrupt transition of the dopant concentration cannot be realized.

In order to enable a memory cell array of this type to have a small structural width that is of or below the order of magnitude of the occurring outdiffusion of the dopant atoms from the buried bit lines, the individual memory cells may be formed as trench transistors. In the case of memory transistors of this type, the respective gate electrode is situated in a trench produced in the semiconductor material between the doped source/drain regions. Only the outdiffusion of the dopant from the source/drain regions downward in the direction of the substrate is significant in the case of a structure of this type. If the trenches are deep enough, so that the trench bottom lies deeper in the substrate than the boundary of the outdiffused dopant, it is the case in the memory transistor thus patterned that at least the lateral structural width determined by photolithography is smaller than the outdiffusion length. As a result, it is possible to achieve a miniaturization of the memory cells, but the blurring of the dopant profile in the region of the pn junction cannot be prevented.

SUMMARY OF THE INVENTION

It is accordingly an object of the invention to provide a memory cell array that overcomes the above-mentioned disadvantages of the prior art devices of this general type, in which the bit lines are better demarcated.

With the foregoing and other objects in view there is provided, in accordance with the invention, a memory cell array. The memory cell array contains a semiconductor body having a doped well of a first conductivity typed formed therein and a top side, and a matrix-shaped configuration of memory transistors. Each of the memory transistors has, at the top side of the semiconductor body, source/drain regions, a channel region disposed between the source/drain regions, a gate dielectric with a storage layer, and a gate electrode isolated from the channel region by the gate dielectric. Word lines are disposed parallel to and at a distance from one another and have a row-wise connection to the gate electrodes. Bit lines are disposed parallel to and at a distance from one another and have a column-wise connection to the source/drain regions. The bit lines are applied as strips of a semiconductor material doped for a second conductivity type being opposite the first conductivity type, on the top side of the semiconductor such that the source/drain regions are connected to one another column-wise. A barrier layer is disposed as a diffusion barrier between the top side of the semiconductor body and the bit lines.

In the memory cell array, the bit lines are not formed by implantations into the semiconductor body, but rather by a highly doped layer of semiconductor material, preferably of polysilicon, on the top side of a semiconductor body or substrate, the layer being patterned in strip form. A thin barrier layer is provided between the semiconductor material provided for the bit lines and the semiconductor material of the semiconductor body or substrate, which barrier layer as a diffusion barrier at least largely prevents the outdiffusion of the dopant.

The channel regions are disposed in a doped well of a first conductivity type. Adjoining the latter are the source/drain regions, to which the bit lines are connected. The bit lines are highly doped of a second conductivity type having an opposite sign and are disposed in such a way that the source/drain regions are electrically conductively connected to one another in strip-type fashion. Portions of the barrier layer are situated between the bit lines and the source/drain regions. Since the barrier layer is made very thin, it does not impair the functioning of the component. The essential constituent part of the bit lines is the strip-type doped semiconductor layer, which functions both as a low-impedance electrically conductive connection and as an electrode of source or drain. A better demarcated dopant profile is achieved with the barrier layer, the pn junction preferably being situated at or in the barrier layer. It lies within the scope of the invention for dopant atoms of the bit lines to be outdiffused into the regions of the semiconductor body that are present below the barrier layer. If the memory transistors are patterned as trench transistors, with this configuration of the bit lines it is possible to reduce the trench depth compared with conventional memory cell arrays of this type.

During the read-out of the programmed memory cells, the diffusion barrier does not act as an electrical insulation on account of the small thickness of the barrier layer. The charge carriers tunnel through it. During programming or erasure, a more sharply demarcated dopant profile is advantageous for optimizing the programming or erasure operation. This relates in particular to the configuration as charge trapping memory cells, for example with an ONO storage layer sequence.

In accordance with an added feature of the invention, the bit lines are formed of an n-conductively doped polysilicon.

In accordance with an additional feature of the invention, the barrier layer is formed of a silicon oxide of at least one atomic layer. Alternatively, the barrier layer is formed of a silicon nitride of at least one atomic layer. Preferably, the barrier layer is formed of $Al_2O_3$ of at least one atomic layer.

In accordance with a further feature of the invention, the storage layer is provided for programming by charge trapping.

In accordance with another feature of the invention, the semiconductor body has trenches formed therein. The gate electrodes are each disposed in one of the trenches between the source/drain regions, and the storage layer is present at least between a respective one of the gate electrodes and the source/drain regions.

Other features which are considered as characteristic for the invention are set forth in the appended claims.

Although the invention is illustrated and described herein as embodied in a memory cell array, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
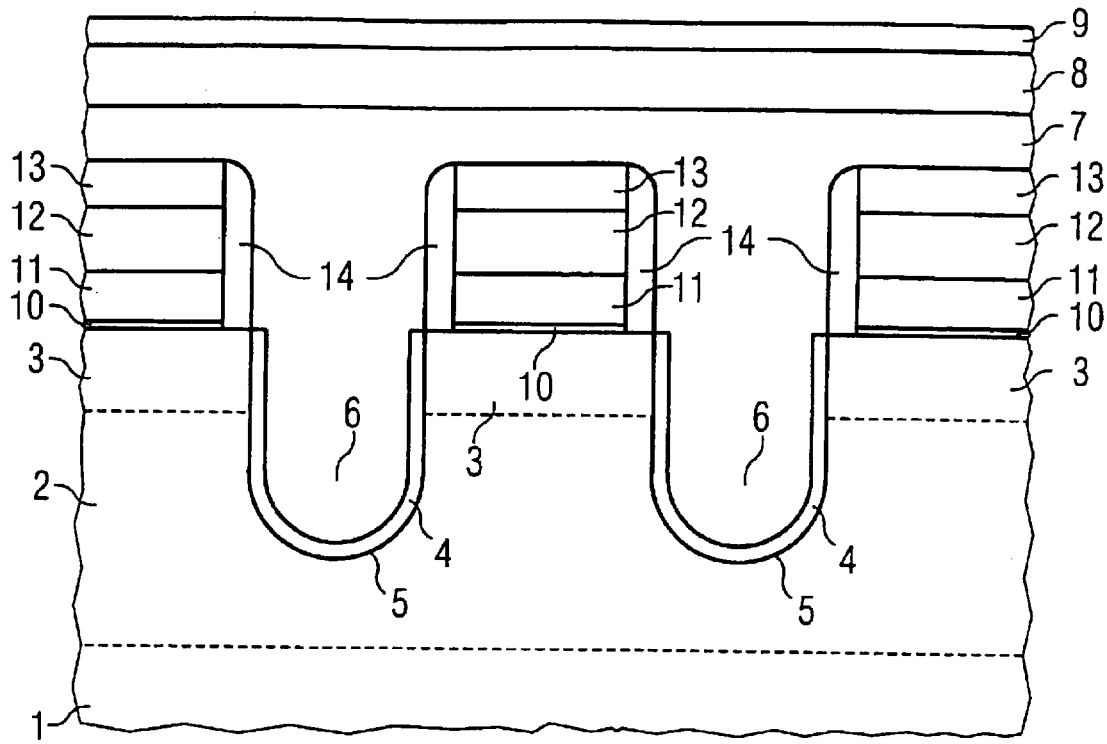
FIG. 1 is a diagrammatic, sectional view of a memory cell array having trench transistors.

Referring now to the figures of the drawing in detail and first, particularly, to FIG. 1 thereof, there is shown a detail from a memory cell array having trench transistors in cross section. A well 2 doped for a first conductivity type, preferably for p-type conductivity, is formed in a semiconductor body 1 or substrate made of a semiconductor material by the introduction of a dopant. In the exemplary embodiment, diffusion regions 3 of an opposite second conductivity type, that is to say n-type conductivity in the example specified, are situated at the top side. The diffusion regions 3 form at least a portion of the source/drain regions. In memory transistors in accordance with the prior art, regions doped for the opposite conductivity sign to that of the well 2 are disposed at this point, the regions each forming a section of the buried bit lines.

In accordance with the exemplary embodiment, trenches which are oriented parallel to one another and are disposed at a distance from one another and whose walls are provided with a gate dielectric 4 are situated between the diffusion regions 3. The gate dielectric 4 has a storage layer that is present at least between a respective gate electrode 6 disposed in the trench and the source/drain regions. The walls and the bottom of the trench form a channel region 5.

In this configuration, portions of a thin barrier layer 10 are in each case situated on the diffusion regions 3 of the second conductivity type. Disposed above the portions are the bit lines 11 configured in strip form running perpendicularly to the plane of the drawing, the bit lines 11 are formed of a semiconductor material, preferably polysilicon, doped for the second conductivity type.

The diffusion regions 3 are produced by dopant atoms that outdiffuse from the doped semiconductor material of the bit lines 11 through the barrier layer 10 into the semiconductor material of the semiconductor body. If the barrier layer 10 prevents outdiffusion of the dopant to such a large extent that the semiconductor material of the doped well 2 does not have its doping reversed to the opposite conductivity type, no diffusion regions 3 of the type described are present or ascertainable.

In order to reduce the electrical bulk resistance, at least one further strip-type bit line layer 12 made of metal or a metal-containing material, for example W and/or WN, may in each case be applied on the actual bit lines 11.

A dielectric covering 13, for example made of nitride, and also dielectric spacers 14, for example likewise nitride, electrically insulate the bit lines 11 from the gate electrodes 6 and word lines 7 made of an electrically conductive material. A further word line layer 8 may likewise be provided on the word lines 7 for the purpose of reducing the electrical bulk resistance. The word lines are covered toward the top by an electrically insulating passivation 9. What is essential to the configuration according to the invention are the barrier layer 10 and the strip-type bit lines 11 made of a highly doped semiconductor material, the bit lines being applied outside the actual semiconductor body 1.

Figure 2:
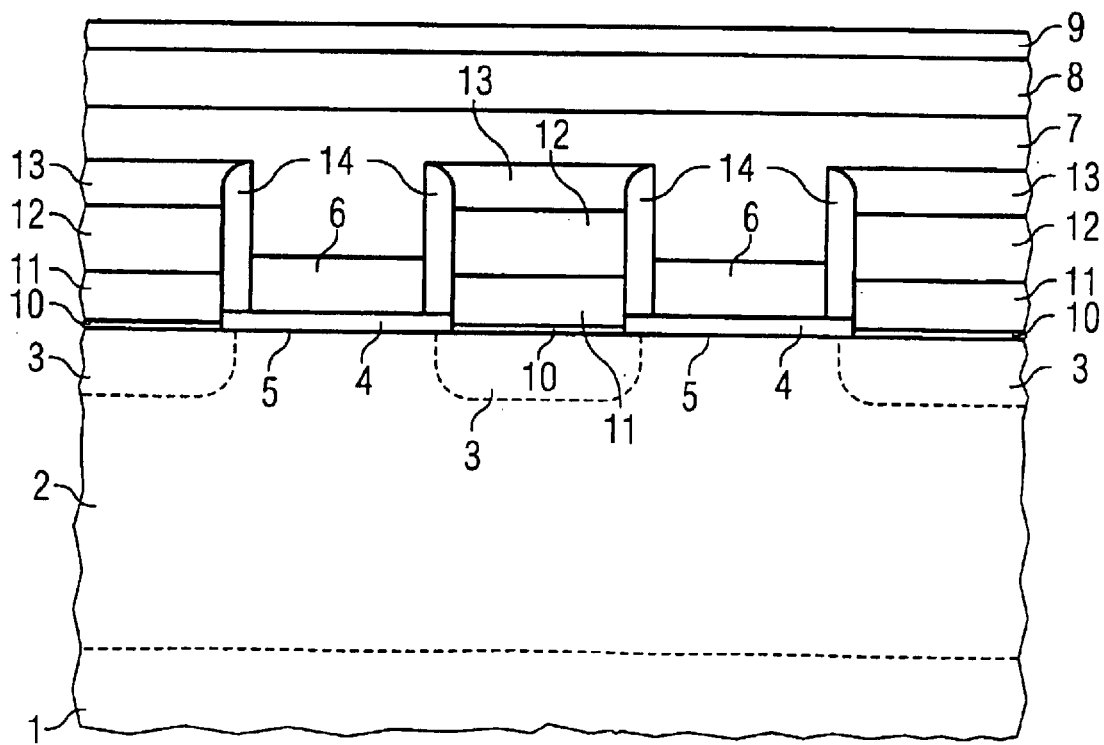
FIG. 2 is a diagrammatic, sectional view of an example of the memory cell array having planar memory transistors.

FIG. 2 illustrates a detail from a further exemplary embodiment of the memory cell array in cross section. The mutually corresponding parts of the memory cell array in accordance with FIG. 1 and of the memory cell array in accordance with FIG. 2 are provided with the same reference symbols, and so it is unnecessary to specify the details of the configuration in accordance with FIG. 2. The barrier layer 10 and the bit lines 11 made of highly doped semiconductor material, the bit lines being applied on the top side, are also present in the exemplary embodiment in accordance with FIG. 2.

In the exemplary embodiment in accordance with FIG. 2, the gate electrodes 6 are depicted separately from the word lines 7 in order to indicate that the gate electrodes 6 may be a material that differs from the material of the word lines 7. This also applies to the exemplary embodiment in accordance with FIG. 1.

In particular when polysilicon is used for the bit lines 11, the barrier layer 10 may be a silicon oxide, in particular silicon dioxide, which has a typical thickness of one or a few atomic layers and is preferably produced as a native oxide or as a thermal oxide. A silicon nitride may also be taken into consideration for the barrier layer, in particular $Si_3N_4$, having a typical thickness of likewise one or a few atomic layers, preferably produced in an RTN step. A further material that is preferably suitable for the barrier layer 10 is $Al_2O_3$, which is preferably produced in one or a few atomic layers by ALD/ALCVD.

During production, it is possible to delimit the memory cell array on a wafer in a manner known per se by a shallow trench isolation (STI) process. The barrier layer 10 is preferably applied over the whole area on a monocrystalline wafer surface in which the well 2 is produced by a suitable doping, preferably a p-type doping. A p-type doping can be produced in silicon by implantation of boron and/or indium.

The semiconductor material provided for the bit lines 11, preferably a polysilicon layer, is then deposited with a typical thickness of about 40 nm. The semiconductor material is highly doped for the opposite conductivity type, accordingly n-conductively in the case of p-type wells. Polysilicon may be n-conductively doped with arsenic, for example, the dopant concentration typically being about $5 \times 10^{20} cm^{-3}$. In this case, it is favorable if the material of the bit lines is applied shortly after the production of the barrier layer 10.

In order to improve the bit lines, even further bit line layers may then be deposited, for example 5 nm of WN and for example 30 nm of W. Depositions of metal-containing layers are suitable in particular, with which it is possible to reduce the electrical bulk resistances of the bit lines. High-temperature-resistant (refractory) metals are particularly suitable in this case. They are, in particular, $WSi_x$ or layer stacks containing WN and W or TiN or TaN. Materials of this type withstand the high process temperatures of up to typically 1,000° C.

Afterward, another layer is deposited, which electrically insulates the bit lines from the word lines that are subsequently to be applied and is preferably a material that is suitable as a hard mask for the patterning of the bit lines. In particular, a nitride of the semiconductor material, in particular $Si_3N_4$, is suitable as such a material. This layer is patterned photolithographically and then used as a hard mask for patterning the layers deposited underneath to form the bit lines running in strip form and parallel to one another.

During the production of trench transistors, it is possible to etch directly into the semiconductor material in order to form the trenches. The spacers 14 depicted in FIG. 1 are preferably produced, however, before the actual trench etching, which spacers electrically insulate the bit line stack laterally and somewhat reduce the trench width. The spacers 14 may likewise be produced from nitride, which is done in a manner known per se by the material of the spacers first being deposited conformally over the whole area and then being etched back anisotropically. Reactive ion etching (RIE) is suitable, in particular, for the etching of the trenches. The gate dielectric 4 with the storage layer is then applied to the walls of the trenches. In particular, a layer sequence suitable for charge trapping memory cells, for example an oxide-nitride-oxide layer sequence, is preferred for this purpose. Such a layer sequence serves for programming the memory cell by trapping hot electrons from the channel region. The oxide layers delimiting the actual storage layer may be produced by deposition processes or else directly by thermal oxidation.

The material of the gate electrodes 6, for example doped polysilicon, is then deposited into the trenches. The trenches are preferably filled completely with this material, so that a layer is also formed on the top side of the bit line stacks, which may subsequently be patterned to form the word lines 7. A layer sequence containing WN/W or $WSi_x$ may be applied to the polysilicon. The gate electrodes may also be produced from metal or a metal-containing material. That is known per se from other memory cell arrays. The word lines are then patterned running in strip form transversely with respect to the bit lines. There follow customary method steps for the driving periphery and the wiring.

The exemplary embodiment in accordance with FIG. 2 may alternatively be produced in such a way that the storage layer sequence, in particular an ONO layer sequence, is applied to the wafer top side over the whole area after the implantation of the wells. An auxiliary layer is then applied over the whole area, which auxiliary layer is patterned using a mask to form strip-type portions in the region of the bit lines to be produced.

The spacers 14 depicted in FIG. 2 are produced on the side walls of the remaining strip-type portions. The material of the barrier layer 10, of the bit lines 11 and possibly of further bit line layers 12 and also of an electrically insulating covering 13 is then deposited into the openings between the spacers. The bit lines are thus already electrically insulated toward the outside.

After the removal of the auxiliary layer the now uncovered regions of the storage layer sequence can then be provided with the gate electrodes. Here, too, this is preferably done by deposition of highly doped polysilicon. The remaining layers provided for the word lines are then deposited. The electrically insulating passivation 9 is preferably applied after the strip-type patterning of the word lines 7 and further word line layers 8, so that the surface is planarized.

I claim:

1. A memory cell array, comprising:

a semiconductor body having a doped well of a first conductivity typed formed therein and a top side;

a matrix-shaped configuration of memory transistors, each of said memory transistors having, at said top side of said semiconductor body, source/drain regions, a channel region disposed between said source/drain regions, a gate dielectric with a storage layer, and a gate electrode isolated from said channel region by said gate dielectric;

word lines disposed parallel to and at a distance from one another and having a row-wise connection to said gate electrodes;

bit lines disposed parallel to and at a distance from one another and having a column-wise connection to said source/drain regions, said bit lines being applied as strips of a semiconductor material doped for a second conductivity type being opposite said first conductivity type, on said top side of said semiconductor such that said source/drain regions being connected to one another column-wise; and a barrier layer disposed as a diffusion barrier between said top side of said semiconductor body and said bit lines.

2. The memory cell array according to claim 1, wherein said bit lines are formed of an n-conductively doped polysilicon.

3. The memory cell array according to claim 1, wherein said barrier layer is formed of a silicon oxide of at least one atomic layer.

4. The memory cell array according to claim 1, wherein said barrier layer is formed of a silicon nitride of at least one atomic layer.

5. The memory cell array according to claim 1, wherein said barrier layer is formed of $Al_2O_3$ of at least one atomic layer.

6. The memory cell array according to claim 1, wherein said storage layer is provided for programming by charge trapping.

7. The memory cell array according to claim 1, wherein said semiconductor body has trenches formed therein, said gate electrodes are each disposed in one of said trenches between said source/drain regions, and said storage layer is present at least between a respective one of said gate electrodes and said source/drain regions.

* * * * *